(12) United States Patent
Sonehara et al.

(10) Patent No.: US 9,991,276 B2
(45) Date of Patent: Jun. 5, 2018

(54) SEMICONDUCTOR DEVICE

(71) Applicant: TOSHIBA MEMORY CORPORATION, Minato-ku (JP)

(72) Inventors: Takeshi Sonehara, Yokkaichi (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 55 days.

(21) Appl. No.: 15/070,785

(22) Filed: Mar. 15, 2016

(65) Prior Publication Data

US 2017/0077133 A1 Mar. 16, 2017

Related U.S. Application Data

(60) Provisional application No. 62/217,469, filed on Sep. 11, 2015.

(51) Int. Cl.
*H01L 27/11* (2006.01)
*H01L 27/11582* (2017.01)

(52) U.S. Cl.
CPC .............. *H01L 27/11582* (2013.01)

(58) Field of Classification Search
CPC ......... H01L 21/28273; H01L 21/28282; H01L 21/764; H01L 21/02532; H01L 21/02595; H01L 21/04; H01L 21/31144; H01L 21/8221
USPC ...................... 257/314, 326, 321, 316, E29.3
See application file for complete search history.

(56) References Cited

U.S. PATENT DOCUMENTS

| 7,989,880 | B2 | 8/2011 | Wada et al. |
| 8,492,824 | B2 | 7/2013 | Yahashi |
| 2014/0264718 | A1 | 9/2014 | Wada et al. |
| 2014/0286095 | A1 | 9/2014 | Hishida et al. |
| 2015/0137205 | A1 | 5/2015 | Kim et al. |
| 2016/0365352 | A1* | 12/2016 | Nishikawa ........ H01L 27/11582 |

FOREIGN PATENT DOCUMENTS

| CN | 103915398 A | 7/2014 |
| JP | 2014-187176 A | 10/2014 |

* cited by examiner

*Primary Examiner* — William F Kraig
*Assistant Examiner* — Rodolfo D. Fortich
(74) *Attorney, Agent, or Firm* — Oblon, McClelland, Maier & Neustadt, L.L.P.

(57) ABSTRACT

According to one embodiment, a semiconductor device includes a substrate; a first structure; a second structure; a step; an insulating layer; a first pillar; a second pillar; a first contact portion; and a second contact. The first structure includes a first electrode layer and a first insulator. The first structure has a first terrace on a surface of the first insulator. The second structure includes a second electrode layer and a second insulator. The second structure has a second terrace on a surface of the second insulator. The second contact portion is electrically connected to the second electrode layer via the second terrace. The first contact portion is located between the step and the first pillar. The step is located between the first contact portion and the second pillar.

9 Claims, 16 Drawing Sheets

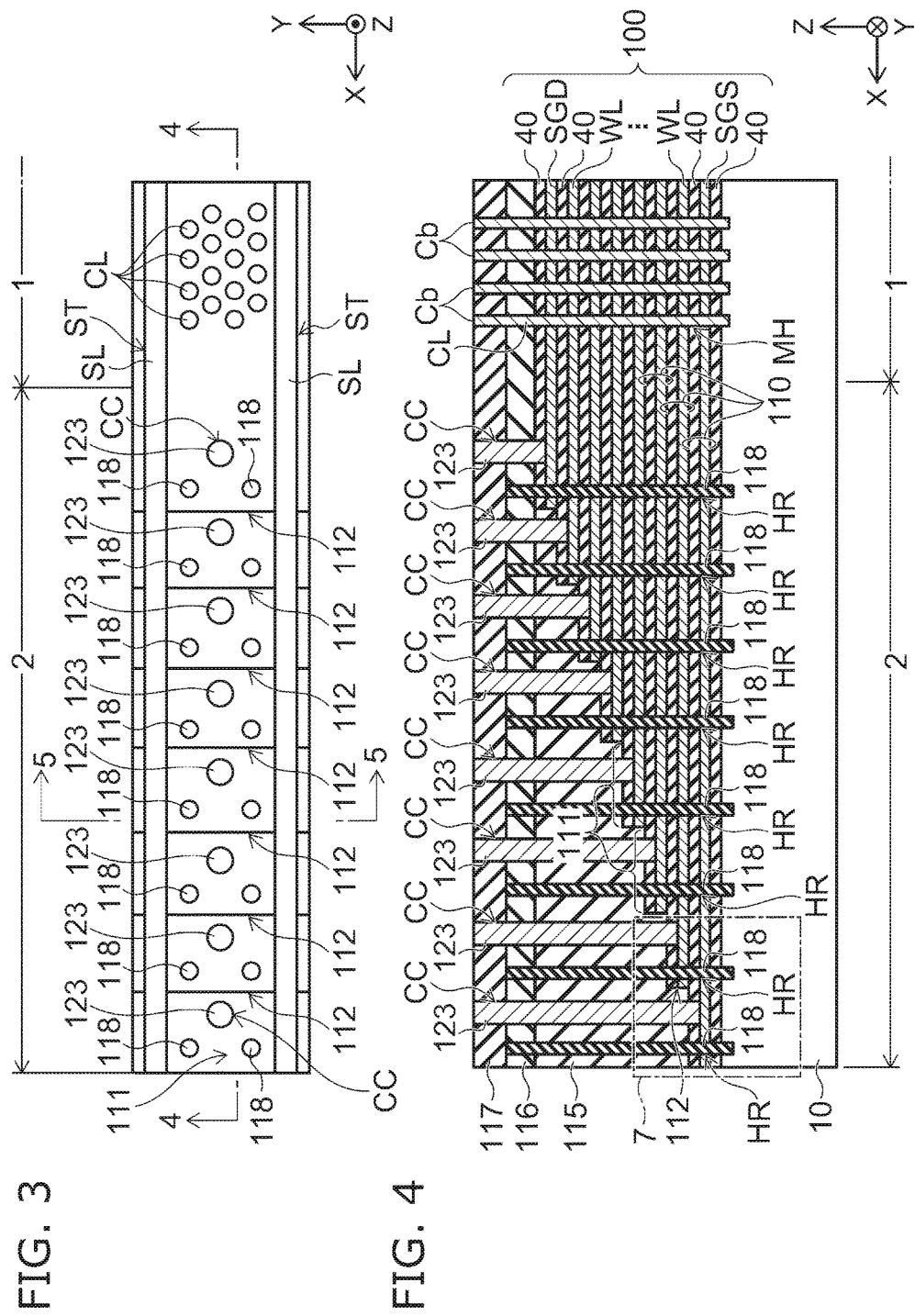

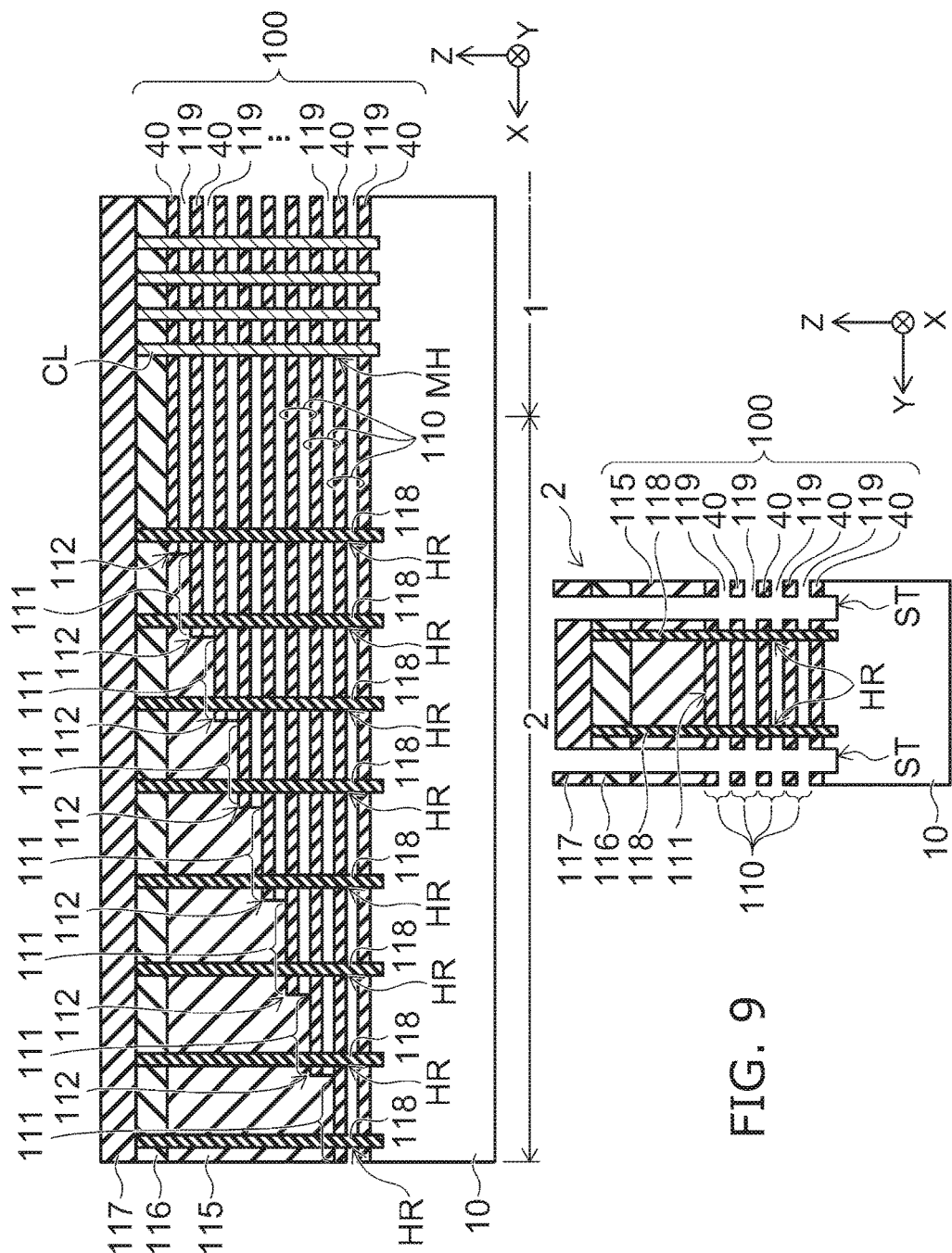

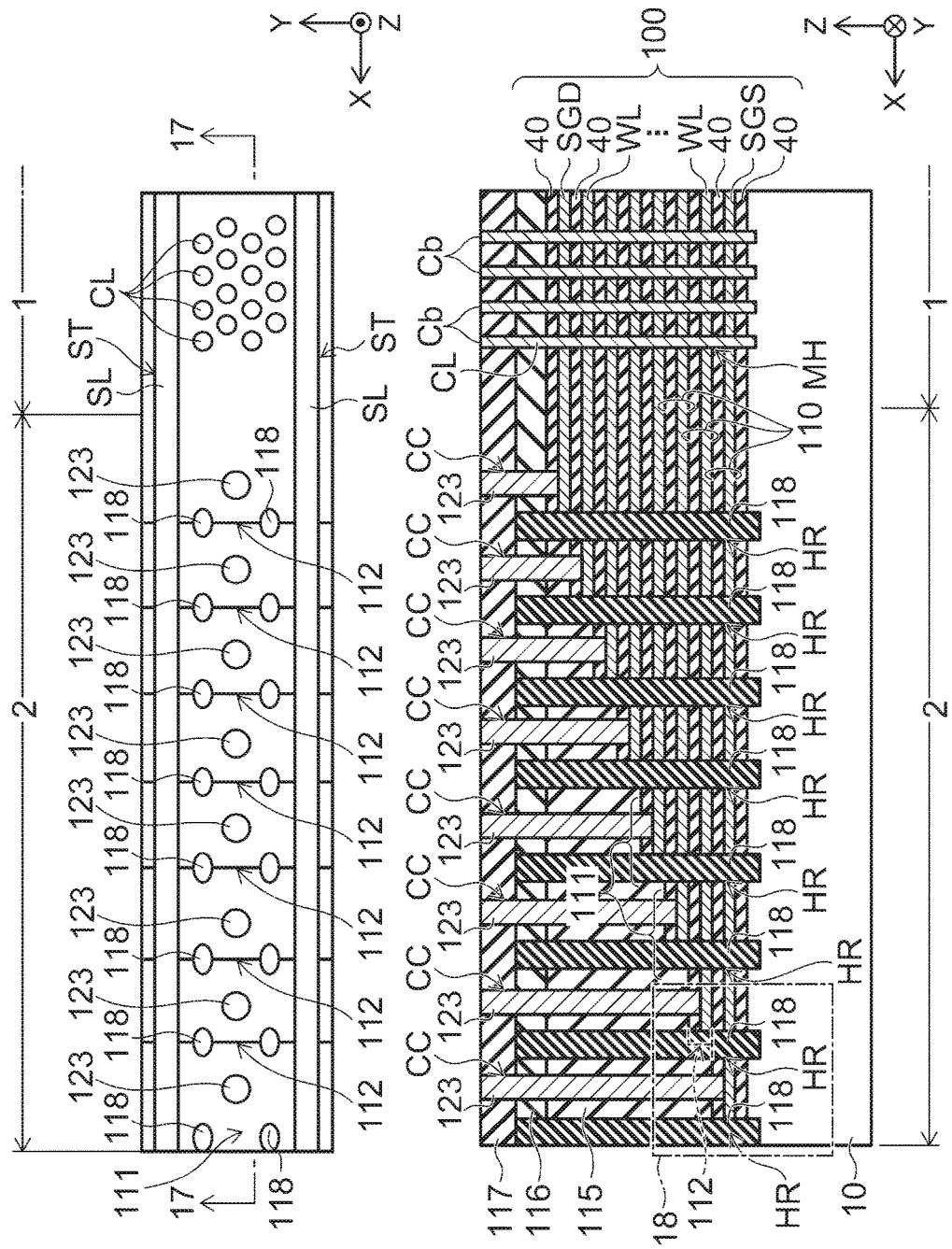

SEMICONDUCTOR DEVICE

CROSS-REFERENCE TO RELATED APPLICATIONS

This application is based upon and claims the benefit of priority from U.S. Provisional Patent Application 62/217, 469 field on Sep. 11, 2015; the entire contents of which are incorporated herein by reference.

FIELD

Embodiments described herein relate generally to a semiconductor device.

BACKGROUND

A memory device having a three-dimensional structure has been proposed, in which memory holes are formed in a stacked body including a plurality of electrode layers stacked therein, and a charge storage film and a semiconductor film extending in the staking direction of the stacked body are provided in the memory holes. The memory device has a plurality of memory cells series-connected between a drain-side select transistor and a source-side transistor. The first electrode layers of the stacked body are gate electrodes of the drain-side select transistor, the source-side transistor, and the memory cells. A staircase structure portion in which the stacked body is processed like a staircase is outside of a memory cell array in which the memory cells are disposed. A memory peripheral circuit is electrically connected to the drain-side select transistor, the source-side transistor, and the memory cells via the staircase structure portion. For higher density of the memory device, shrink of the staircase structure portion is desired.

BRIEF DESCRIPTION OF THE DRAWINGS

FIG. 3 is a schematic plan view of the memory cell array and the staircase structure portion of the semiconductor device of the first embodiment;

FIG. 4 is a schematic sectional view along line 4-4 in FIG. 3;

FIG. 8 and FIG. 9 are schematic sectional views showing the replacing process;

FIG. 16 is a schematic plan view of the memory cell array and the staircase structure portion of the semiconductor device of a second embodiment;

FIG. 17 is a schematic sectional view along line 17-17 in FIG. 16;

DETAILED DESCRIPTION

Figure 1:
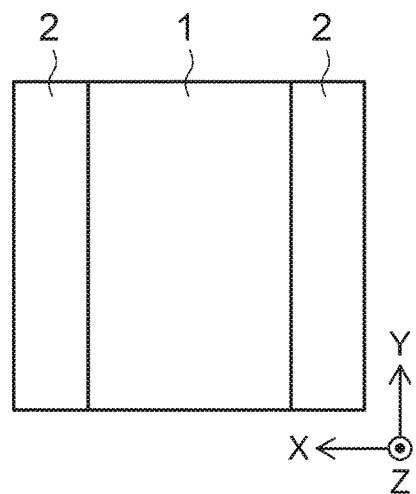
FIG. 1 is a schematic plan view showing a planar layout of a semiconductor device of a first embodiment.

According to one embodiment, a semiconductor device includes a substrate; a first structure; a second structure; a step; an insulating layer; a first pillar; a second pillar; a first contact portion; and a second contact portion. The first structure includes a first electrode layer and a first insulator. The first structure has a first terrace on a surface of the first insulator. The second structure is provided on the first structure except a part on the first terrace. The second structure includes a second electrode layer and a second insulator. The second structure has a second terrace on a surface of the second insulator. The step is provided between the first terrace and the second terrace. The insulating layer is provided on the first terrace and the second terrace. The first pillar is provided in the insulating layer and the first structure. The first pillar reaches the substrate via the first terrace. The second pillar is provided in the insulating layer, the second structure, and the first structure. The second pillar reaches the substrate via the second terrace. The second pillar is adjacent to the first pillar via the step. The first contact portion is provided in the insulating layer and the first insulator. The first contact portion is electrically connected to the first electrode layer via the first terrace. The second contact portion is provided in the insulating layer and the second insulator. The second contact portion is electrically connected to the second electrode layer via the second terrace. The first contact portion is located between the step and the first pillar. The step is located between the first contact portion and the second pillar.

Embodiments will now be described with reference to the drawings. In the respective drawings, like members are labeled with like reference numerals. Semiconductor devices of the embodiments are semiconductor memory devices having memory cell arrays.

FIG. 1 is a schematic plan view showing a planar layout of a semiconductor device of a first embodiment.

The semiconductor device of the first embodiment has a memory cell array 1 and a staircase structure portion 2. The memory cell array 1 and the staircase structure portion 2 are provided on a substrate. The staircase structure portion 2 is provided outside of the memory cell array 1. In FIG. 1, two directions parallel to a major surface of the substrate and orthogonal to each other are an X-direction (first direction) and a Y-direction (second direction), and a direction orthogonal to both the X-direction and the Y-direction is a Z-direction (third direction, stacking direction).

Figure 2:
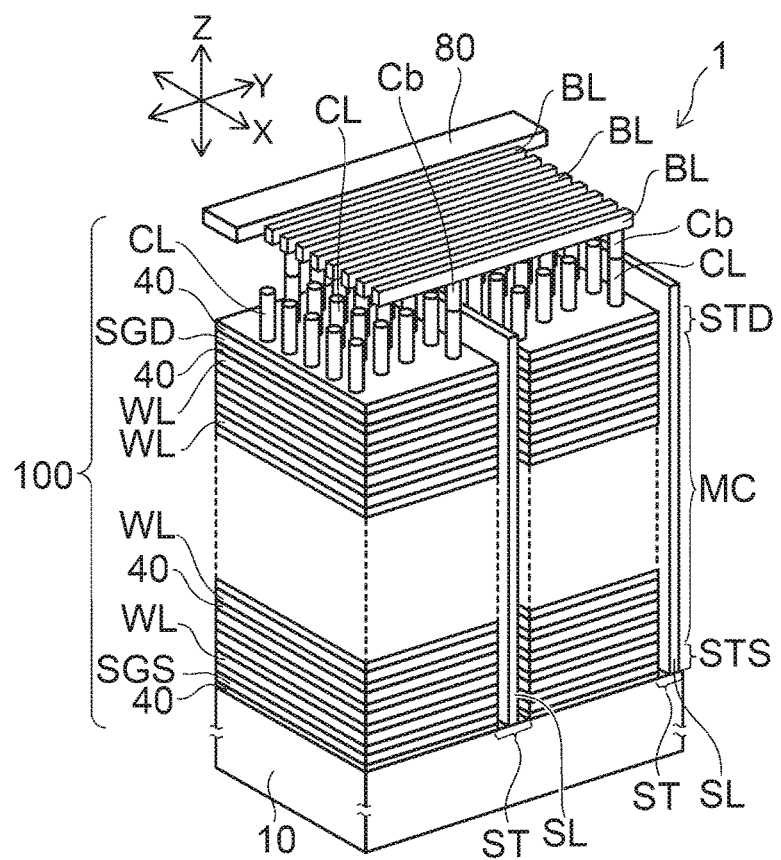
FIG. 2 is a schematic perspective view of a memory cell array of the semiconductor device of the first embodiment.
Figure 5:
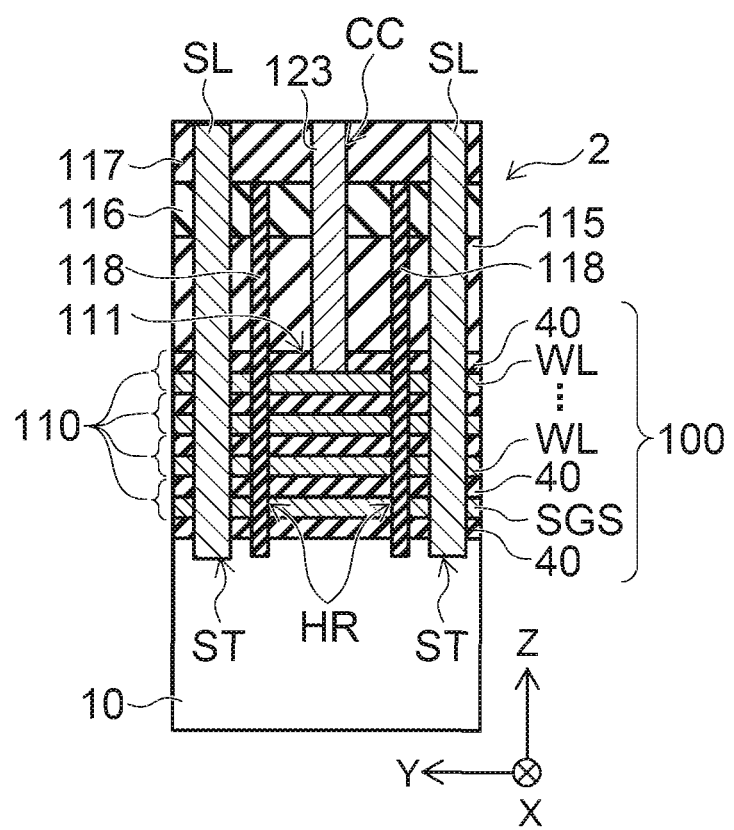
FIG. 5 is a schematic sectional view along line 5-5 in FIG. 3.

FIG. 2 is a schematic perspective view of the memory cell array 1 of the semiconductor device of the first embodiment. FIG. 3 is a schematic plan view of the memory cell array 1 and the staircase structure portion 2 of the semiconductor device of the first embodiment. FIG. 4 is a schematic sectional view along line 4-4 in FIG. 3. FIG. 5 is a schematic sectional view along line 5-5 in FIG. 3.

As shown in FIG. 3 to FIG. 5, the memory cell array 1 has a stacked body 100, a plurality of columnar portions CL, and a plurality of dividing sections ST. The stacked body 100 includes a drain-side select gate line SGD, a plurality of word lines WL, and a source-side select gate line SGS.

The source-side select gate line (lower gate layer) SGS is provided on a substrate 10. The substrate 10 is e.g. a semiconductor substrate. The semiconductor substrate contains e.g. silicon. The plurality of word lines WL is provided on the source-side select gate line SGS. The drain-side select gate line (upper gate layer) SGD is provided on the plurality of word lines WL. The drain-side select gate line SGD, the plurality of word lines WL, and the source-side select gate line SGS are electrode layers. The number of stacked electrode layers may be arbitrary.

The electrode layers (SGD, WL, SGS) are separately stacked. Insulators 40 are disposed between the electrode layers (SGD, WL, SGS). The insulator 40 may be an insulating material such as silicon oxide or an air gap.

A drain-side select transistor STD uses at least one of the select gate lines SGD as a gate electrode. A source-side select transistor STS uses at least one of the select gate lines SGS as a gate electrode. A plurality of memory cells MC is series-connected between the drain-side select transistor STD and the source-side select transistor STS. The memory cell MC uses one of the word lines WL as a gate electrode.

The dividing sections ST are provided in the stacked body 100. The dividing sections ST extend in the stacking direction (Z-direction) and the X-direction in the stacked body 100. The dividing sections ST divide the stacked body 100 in a plurality of pieces in the Y-direction. The regions divided by the dividing sections ST are referred to as "blocks".

A source layer SL is disposed in the dividing section ST. The source layer SL is insulated from the stacked body and spreads e.g. in a plate shape in the Z-direction and the X-direction. An upper layer interconnect 80 is disposed above the source layers SL. The upper layer interconnect 80 extends in the Y-direction. The upper layer interconnect 80 is electrically connected to the plurality of source layers SL arranged along the Y-direction.

The columnar portions CL are provided in the stacked body 100 divided by the dividing sections ST. The columnar portions CL extend in the stacking direction (Z-direction). The columnar portions CL are formed in e.g. circular cylinder shapes or elliptic cylinder shapes. The columnar portions CL are disposed in e.g. a staggered arrangement or a square grid pattern in the memory cell array 1. The drain-side select transistor STD, the plurality of memory cells MC, and the source-side select transistor STS are disposed in the columnar portions CL.

A plurality of bit lines BL is disposed above upper ends of the columnar portions CL. The plurality of bit lines BL extends in the Y-direction. The upper end of the columnar portion CL is electrically connected to one of the bit lines BL via a contact portion Cb. One bit line is electrically connected to one columnar portion CL selected from each block.

Figure 6:
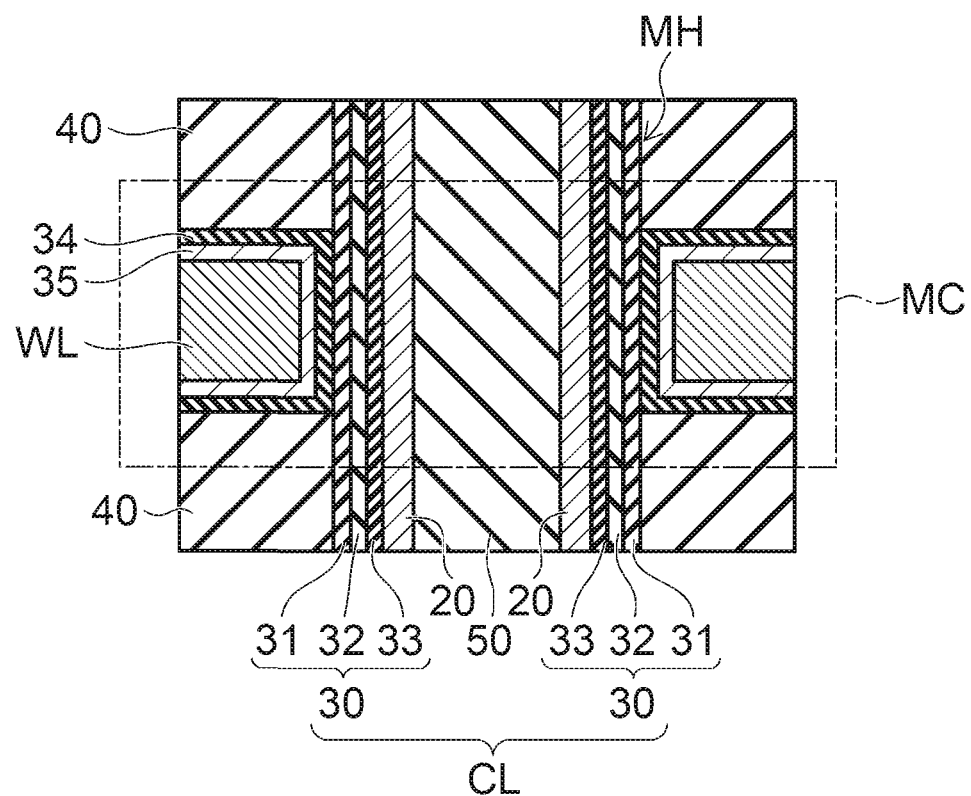
FIG. 6 is a schematic sectional view of the columnar portion of the semiconductor device of the first embodiment.

FIG. 6 is a schematic sectional view of the columnar portion CL of the semiconductor device of the first embodiment. FIG. 6 corresponds to a section parallel to the Y-Z plane in FIG. 2. FIG. 6 extracts and shows a middle portion of the columnar portion CL. FIG. 6 shows the memory cell MC.

The columnar portion CL is provided in a memory hole (open hole) MH. The memory hole MH is provided in the stacked body 100. The columnar portion CL includes a memory film 30, a semiconductor body 20, and a core layer 50.

The memory film 30 is provided on an inner wall of the memory hole MH. The shape of the memory hole 30 is e.g. a tubular shape. The memory film 30 includes a cover insulating film 31, a charge storage film 32, and a tunnel insulating film 33.

The cover insulating film 31 is provided on the inner wall of the memory hole MH. The cover insulating film 31 contains e.g. silicon oxide or silicon oxide and aluminum oxide. The cover insulating film 31 protects e.g. the charge storage film 32 from etching when the word lines WL are formed.

The charge storage film 32 is provided on the cover insulating film 31. The charge storage film 32 contains e.g. silicon nitride. The charge storage film 32 may contain e.g. hafnium oxide in addition to silicon nitride. The charge storage film 32 has a trap site for trapping charge and traps charge. The threshold value of the memory cell MC changes depending on presence or absence of the trapped charge and the amount of trapped charge. Thereby, the memory cell MC retains information.

The tunnel insulating film 33 is provided on the charge storage film 32. The tunnel insulating film 33 contains e.g. silicon oxide or silicon oxide and silicon nitride. The tunnel insulating film 33 is a potential barrier between the charge storage film 32 and the semiconductor body 20. When charge is injected from the semiconductor body 20 into the charge storage film 32 (writing operation) and when charge is diffused from the charge storage film 32 into the semiconductor body 20 (erasing operation), the change is tunneled through the tunnel insulating film 33.

A block insulating film 34 and a barrier film 35 are provided between the word line WL and the insulator 40 and between the word line WL and the memory film 30.

The block insulating film 34 is provided on the insulators 40 and the cover insulating film 31. The block insulating film 34 e.g. contains silicon oxide or silicon oxide and aluminum oxide. The block insulating film 34 suppresses back tunneling of charge from the word line WL to the charge storage film 32 in the erasing operation.

The barrier film 35 is provided on the block insulating film 34. The barrier film 35 contains e.g. titanium and titanium nitride.

The word line WL is provided on the barrier film 35. The word line WL contains e.g. tungsten.

The block insulating film 34, the barrier film 35, and the word line WL surround the columnar portion CL.

On the memory film 30, the semiconductor body 20 is provided. The semiconductor body 20 contains e.g. silicon. The silicon is e.g. polysilicon formed by crystallization of amorphous silicon. The conductivity type of the silicon is e.g. the P-type. The shape of the semiconductor body 20 is e.g. a tubular shape having a bottom. The semiconductor body 20 is electrically connected to e.g. the substrate 10.

The core layer 50 is formed on the semiconductor body 20. The core layer 50 has an insulation property. The core layer 50 contains e.g. silicon oxide. The shape of the core layer 50 is e.g. a columnar shape.

The memory hole MH is buried by the memory film 30, the semiconductor body 20, and the core layer 50.

As shown in FIG. 4, the stacked body 100 includes the staircase structure portion 2. The stacked body 100 includes a plurality of structures 110 in the staircase structure portion 2. The staircase structure portion 2 is obtained by stacking of the structures 110 in a staircase pattern. The structure 110 includes the electrode layer SGS, WL, or SGD and the insulator 40. In the staircase structure portion 2, a part in which the upper surface of the structure 110 is exposed is referred to as "terrace 111". In the staircase structure portion 2, a part in which the side surface of the structure 110 is exposed is referred to as "step 112".

Figure 7:
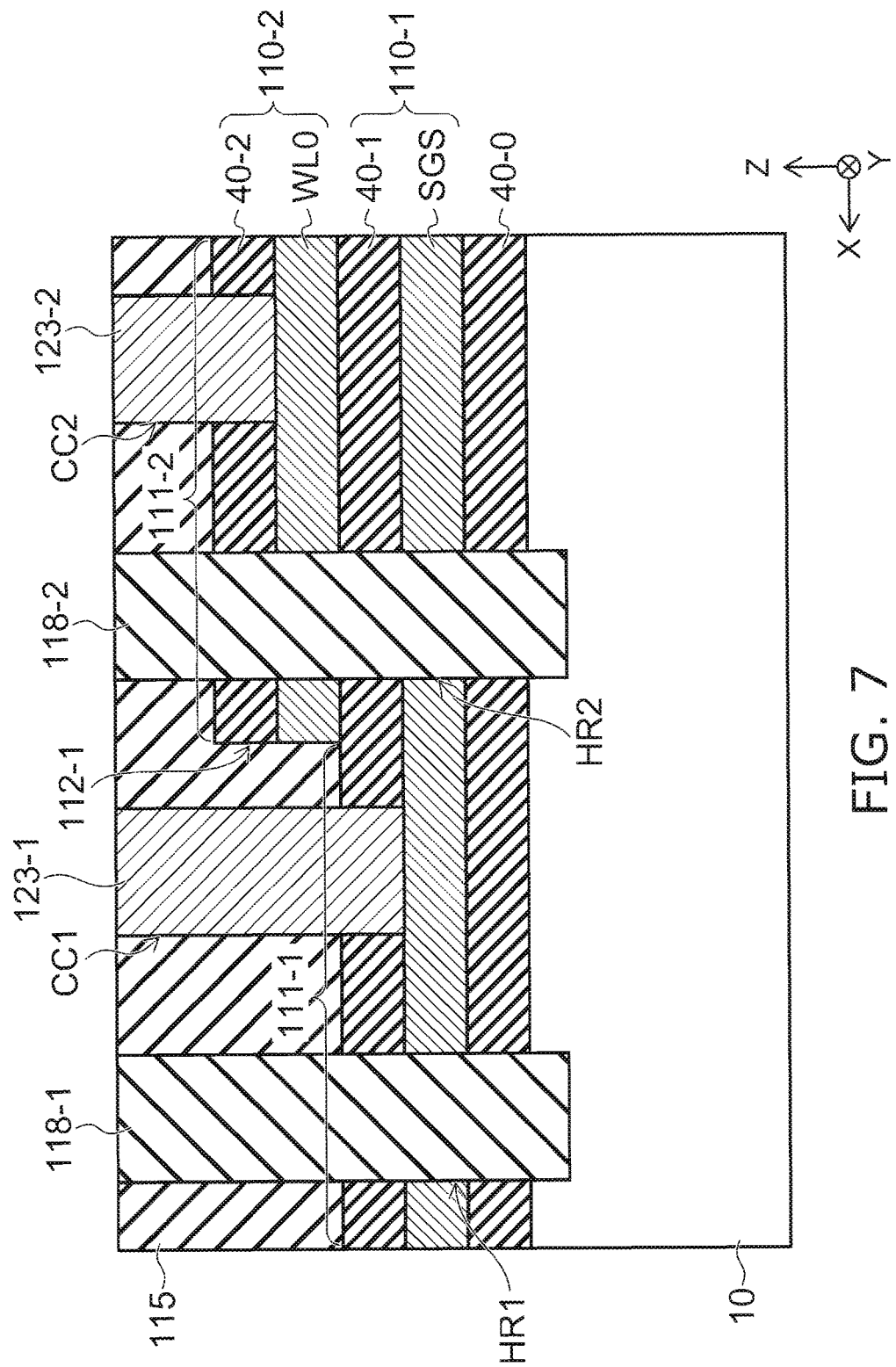
FIG. 7 is a schematic enlarged sectional view showing inside of a frame 7 in FIG. 4

FIG. 7 is a schematic enlarged sectional view showing inside of a frame 7 in FIG. 4. In FIG. 7, two structures 110 are shown. In FIG. 7, for convenience, the structures are referred to as a first structure 110-1 and a second structure 110-2.

As shown in FIG. 7, the first structure 110-1 is provided on the substrate 10 via e.g. a lowermost insulator 40-0. The first structure 110-1 includes the electrode layer SGS and an insulator 40-1. The insulator 40-1 is provided on the electrode layer SGS. The first structure 110-1 has a first terrace 111-1 on the surface of the insulator 40-1.

The second structure 110-2 is provided on the first structure 110-1 except a part on the first terrace 111-1. The second structure 110-2 includes an electrode layer WL0 and an insulator 40-2. The insulator 40-2 is provided on the electrode layer WL0. The second structure 110-2 has a second terrace 111-2 on the surface of the insulator 40-2. A first step 112-1 exists between the first terrace 111-1 and the second terrace 111-2.

First insulating layers 115 are provided on the first terrace 111-1 and the second terrace 111-2. The first insulating layer 115 contains e.g. silicon oxide.

As shown in FIG. 4, for example, the first insulating layer 115 buries a recess produced in the staircase structure portion 2. Thereby, the surface of the semiconductor device is planarized over the memory cell array 1 to the staircase structure portion 2. Second insulating layers 116 are provided on the upper surface of the stacked body 100 and the first insulating layers 115. Third insulating layers 117 are provided on the second insulating layers 116. The second insulating layer 116 contains e.g. silicon oxide. The third insulating layer 117 also contains e.g. silicon oxide.

A plurality of holes HR is provided in the second insulating layers 116 and the first insulating layers 115 in the staircase structure portion 2 and the stacked body 100. The hole HR reaches e.g. the substrate 10 via the terrace 111. For example, the hole HR is provided for each of the structure 110. In the first embodiment, the holes HR are arranged in two rows between the dividing section ST and the dividing section ST along the dividing sections ST. A pillar 118 is provided in the hole HR. The pillars 118 are linearly arranged along the X-direction. In the embodiment, two rows of the pillars 118 linearly arranged along the X-direction are provided. The X-direction is the direction in which the terraces 111 are arranged in the staircase pattern.

For example, as shown in FIG. 7, a first hole HR1 reaches the substrate 10 via the first terrace 111-1 and the first structure 110-1. A first pillar 118-1 is provided in the first hole HR1. A second hole HR2 reaches the substrate 10 via the second terrace 111-2, the second structure 110-2, and the first structure 110-1. A second pillar 118-2 is provided in the second hole HR2. The second pillar 118-2 is adjacent to the first pillar 118-1 via a first step 112-1. The first step 112-1 is a step existing between the first terrace 111-1 and the second terrace 111-2.

The pillars 118 (118-1, 118-2) are pillars that support the insulators 40 in the process of forming the electrode layers (SGD, WL, SGS). The electrode layers (SGD, WL, SGS) are formed by replacement of replacement members provided between the insulator 40 and the insulator 40 by conductive materials. The replacing process is shown in FIG. 8 and FIG. 9.

FIG. 8 and FIG. 9 are schematic sectional views showing the replacing process. FIG. 8 corresponds to the section shown in FIG. 4. FIG. 9 corresponds to the section shown in FIG. 5.

As shown in FIG. 8 and FIG. 9, in the replacing process, the dividing sections ST are formed in the third insulating layers 117, the second insulating layers 116, and the first insulating layers 115, and the stacked body 100. The dividing sections ST are formed, and then, the replacement members provided between the insulator 40 and the insulator 40 are removed via the dividing sections ST. The replacement members are removed, and thereby, spaces 119 are produced between the stacked upper and lower insulator 40 and insulator 40. While the spaces 119 are produced, the insulators 40 are supported by the columnar portions CL in the memory cell array 1 and supported by the pillars 118 in the staircase structure portion 2. For example, in the structure shown in FIG. 7, the first pillar 118-1 supports the insulator 40-1 included in the first structure 110-1. The second pillar 118-2 supports the insulator 40-2 included in the second structure 110-2.

Figure 10:
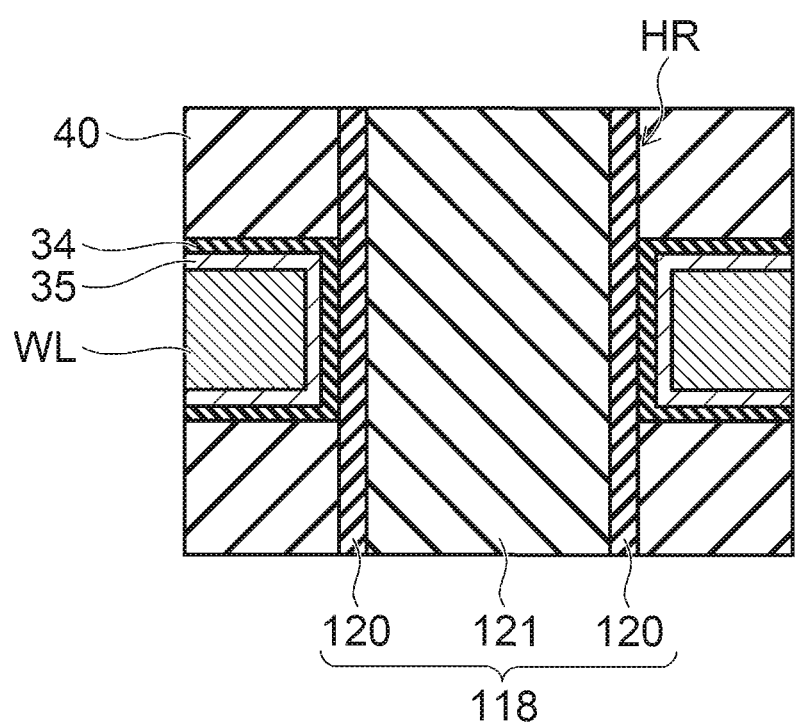
FIG. 10 is a schematic sectional view of the pillar of the semiconductor device of the first embodiment.

FIG. 10 is a schematic sectional view of the pillar 118 of the semiconductor device of the first embodiment. FIG. 10 corresponds to a section parallel to the Y-Z plane in FIG. 2. FIG. 10 extracts and shows a middle part of the pillar 118.

As shown in FIG. 10, the pillar 118 has e.g. an insulation property. The pillar 118 includes e.g. a silicon oxide film 120 and a silicon nitride film 121. The silicon oxide film 120 is provided on e.g. an inner wall of the hole HR. The shape of the silicon oxide film 120 is e.g. a tubular shape having a bottom. The silicon nitride film 121 is provided on the silicon oxide film 120. The shape of the silicon nitride film 121 is e.g. a columnar shape. In the replacing process, e.g. the silicon oxide film 120 serves as a barrier against etching.

As shown in FIG. 3, FIG. 4, and FIG. 5, contact holes CC are provided in the third insulating layers 117, the second insulating layers 116 and the first insulating layers 115. For example, the contact holes CC are provided for each one of the structures 110. A contact portion 123 is provided in the contact hole CC. The contact portion 123 is a conductive layer. The contact portion 123 is electrically connected to the electrode layer SGS, WL, or SGD via the terrace 111.

For example, as shown in FIG. 7, a first contact hole CC1 is provided for the electrode layer SGS of the first structure 110-1 via the first terrace 111-1. A first contact portion 123-1 is electrically connected to the electrode layer SGS via the first terrace 111-1. The first contact portion 123-1 is electrically connected to the memory peripheral circuit via an interconnect (not shown). The memory peripheral circuit is provided on the substrate 10.

A second contact hole CC2 is provided for the electrode layer WL0 of the second structure 110-2 via the second terrace 111-2. A second contact portion 123-2 is electrically connected to the electrode layer WL0 via the second terrace 111-2. The second contact portion 123-2 is also electrically connected to the memory peripheral circuit via an interconnect (not shown).

In the first embodiment, the first contact portion 123-1 is between the first step 112-1 and the first pillar 118-1. The first step 112-1 is between the first contact portion 123-1 and the second pillar 118-2. The first pillar 118-1 and the second pillar 118-2 are adjacent along the direction in which the first terrace 111-1 and the second terrace 111-2 are arranged via the first step 112-1 and the first contact portion 123-1.

Figure 11:
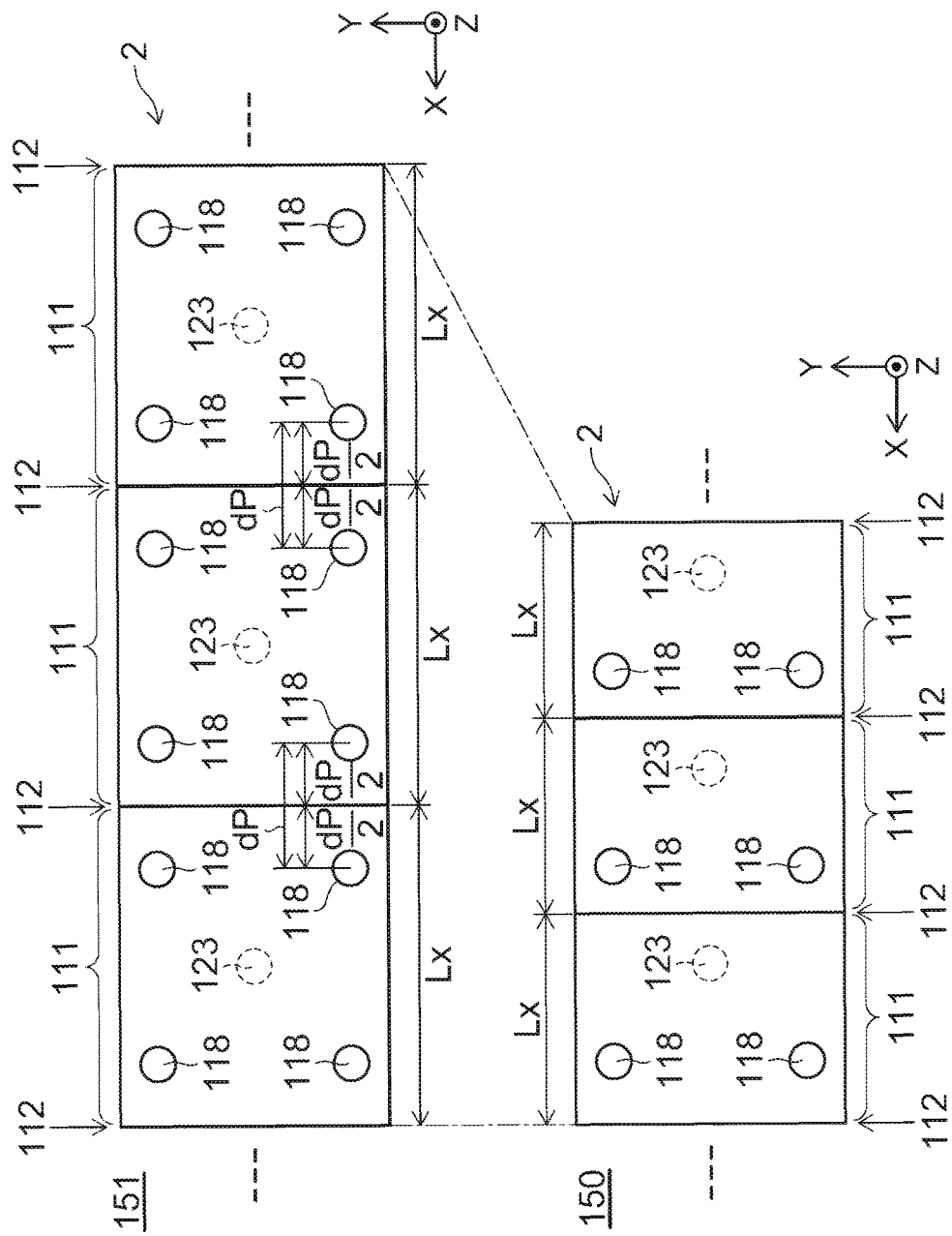
FIG. 11 is a schematic plan view of the staircase structure portion of the semiconductor device of the first embodiment and a semiconductor device of a comparative example.

FIG. 11 is a schematic plan view of the staircase structure portion 2. FIG. 11 shows a semiconductor device 150 of the first embodiment and a semiconductor device 151 of a comparative example.

As shown in FIG. 11, the semiconductor device 150 of the first embodiment includes a structure pattern in which "the step 112, the pillar 118, the contact portion 123, and the step 112" are arranged in the order on the terrace 111. The structure pattern is repeated along the direction in which the terraces 111 are arranged (X-direction) in the staircase structure portion 2.

For example, like the semiconductor device 151 shown in FIG. 11, there are cases that the step 112 is provided between the pillar 118 and the pillar 118, each of the pillars 118 are arranged between the adjacent terraces 111 along the X-direction. In this case, a distance dP between the pillar 118 and the pillar 118 is set to e.g. a process limit value or more. This is because the plurality of pillars 118 is processed in the same process. Accordingly, in the semiconductor device 151, the distance dP=(dP/2)×2) is added to e.g. a length Lx of the terrace 111 along the X-direction.

On the other hand, in the semiconductor device 150 of the first embodiment, the step 112 and the contact portion 123 are provided between the pillar 118 and the pillar 118, each of the pillars 118 are arranged between the adjacent terraces 111 along the X-direction. Accordingly, the distance dP is not added to e.g. the length Lx of the terrace 111 along the X-direction. Compared to the semiconductor device 151, it is possible to shorten e.g. the length Lx of the terrace 111 along the X-direction. Therefore, according to the first embodiment, it is possible to shrink the staircase structure portion 2.

Figure 12:
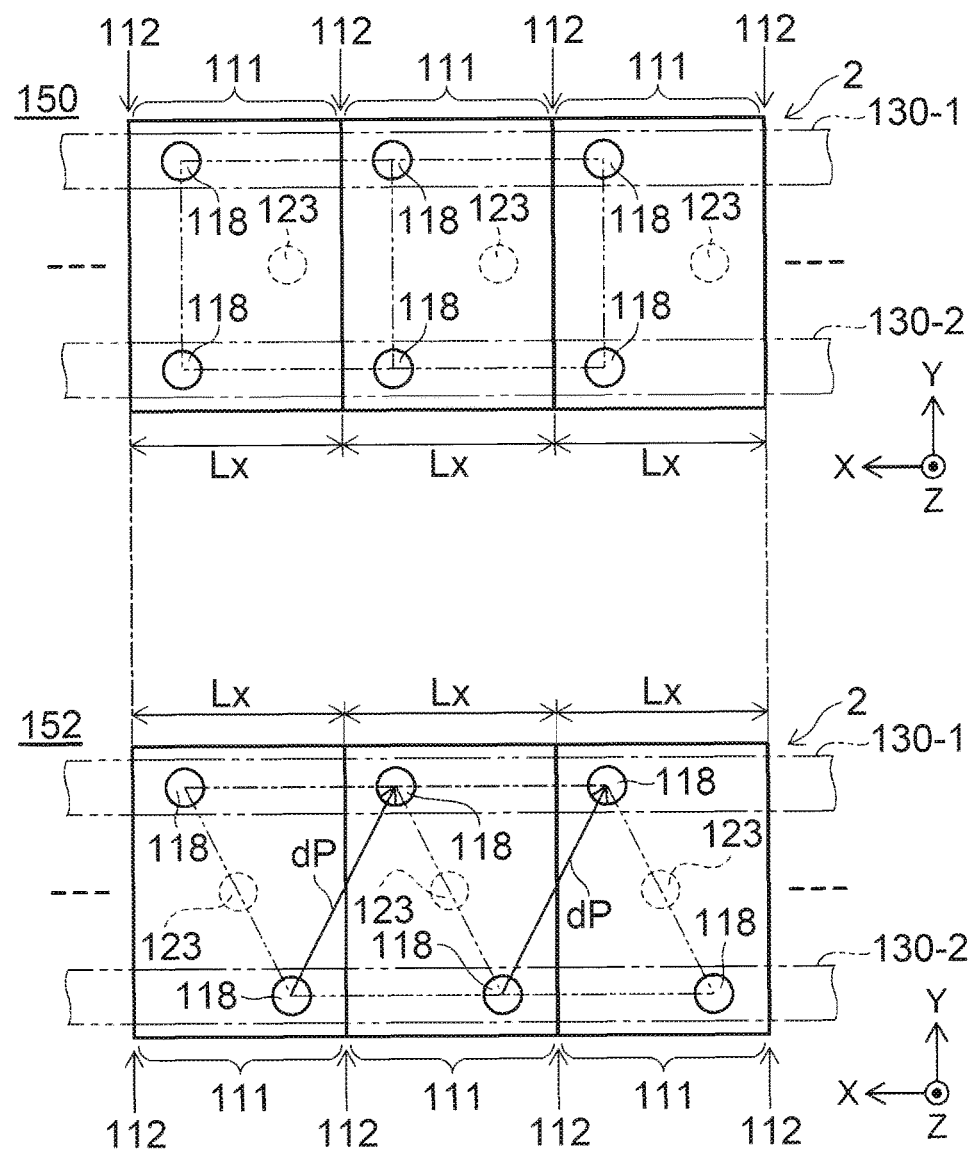
FIG. 12 is a schematic plan view of the staircase structure portion of the semiconductor device of the first embodiment and a first variation of the first embodiment.

FIG. 12 is a schematic plan view of the staircase structure portion 2. FIG. 12 shows the semiconductor device 150 of the first embodiment and a semiconductor device 152 according to a first variation of the first embodiment.

As shown in FIG. 12, the semiconductor device 150 of the first embodiment includes a first row 130-1 and a second row 130-2. The first row 130-1 and the second row 130-2 include a plurality of pillars 118. The first row 130-1 and the second row 130-2 extend along a direction in which the terraces 111 are arranged (X-direction). The plurality of pillars 118 of the contiguous terraces 111 (in the example, four pillars of the contiguous two terraces 111) is arranged in a rectangular pattern in the plan view. The rectangular arrangement pattern is repeated along the X-direction in the staircase structure portion 2. The contact portions 123 are provided in the rectangles.

On the other hand, the semiconductor device 152 according to the first variation of the first embodiment is different from that of the first embodiment in arrangement of the plurality of pillars 118 in the plan view.

In the semiconductor device 152, the plurality of pillars 118 is arranged in a parallelogram pattern in the plan view. The parallelogram arrangement pattern is repeated along the X-direction in the staircase structure portion 2. The contact portions 123 are provided in the parallelograms.

As described above, the plurality of pillars 118 may be arranged in the parallelogram pattern. In the semiconductor device 152, the distance dP is produced on a line connecting the pillars 118 located on the opposing corners of the parallelogram. Accordingly, the distance dP is not added to e.g. the length Lx of the terrace 111 along the X-direction like the semiconductor device 150. Therefore, also, in the semiconductor device 152, it is possible to shrink the staircase structure portion 2.

Figure 13:
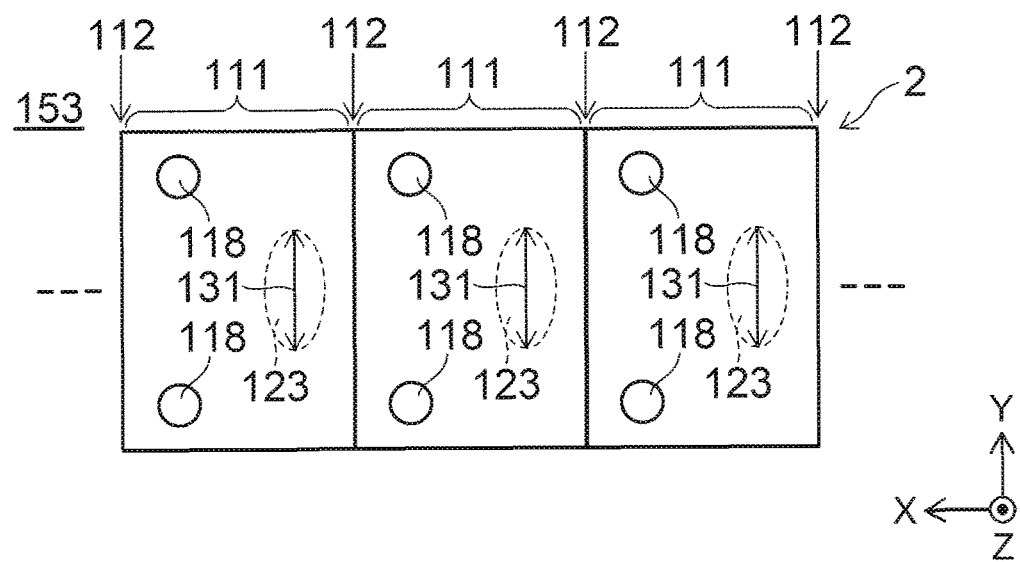
FIG. 13 is a schematic plan view of the staircase structure portion of a second variation of the first embodiment.

FIG. 13 is a schematic plan view of the staircase structure portion 2. FIG. 13 shows a semiconductor device 153 according to a second variation of the first embodiment.

As shown in FIG. 13, the semiconductor device 153 according to the second variation is different from the semiconductor device 150 of the first embodiment in the planar shape of the contact portion 123. In the semiconductor device 153, the planar shape of the contact portion 123 is an elliptic shape.

In the second variation, a major axis 131 of the elliptic extends along the Y-direction. Assuming that the planar shape of the contact portion 123 is an elliptic shape, compared to a circular shape e.g. a perfect circle, it is possible to make the contact areas between the contact portion 123 and the electrode layers (SGD, WL, SGS) larger. Accordingly, the contact resistances between the electrode layers (SGD, WL, SGS) and the contact portion 123 may be reduced. When the terraces 111 are shrunk, the contact portions 123 are also reduced and the contact areas are smaller. However, according to the semiconductor device 153, even when the terraces 111 are shrunk, it is possible to suppress reduction of the contact areas. Therefore, according to the second variation, it is possible to suppress increase of the contact resistances between the electrode layers (SGD, WL, SGS) and the contact portion 123.

Figure 14:
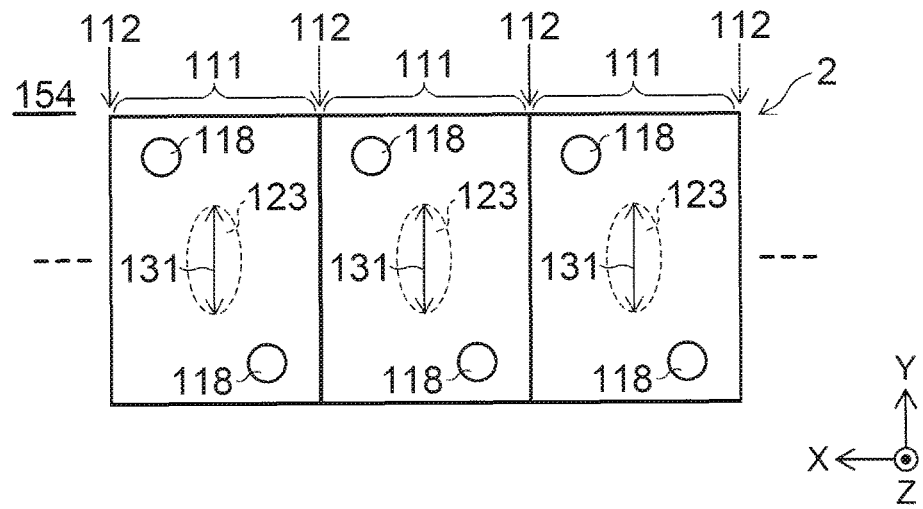
FIG. 14 is a schematic plan view of the staircase structure portion of a third variation of the first embodiment.

FIG. 14 is a schematic plan view of the staircase structure portion 2. FIG. 14 shows a semiconductor device 154 according to a third variation of the first embodiment.

As shown in FIG. 14, the semiconductor device 154 according to the third variation is different from the semiconductor device 152 of the first variation in the planar shape of the contact portion 123. In the semiconductor device 154, the planar shape of the contact portion 123 is an elliptic shape. In the third variation, the major axis 131 of the elliptic extends along the Y-direction.

Like the semiconductor device 154 according to the third variation, the planar shape of the contact portion 123 of the semiconductor device 152 of the first variation may be an elliptic shape.

Figure 15:
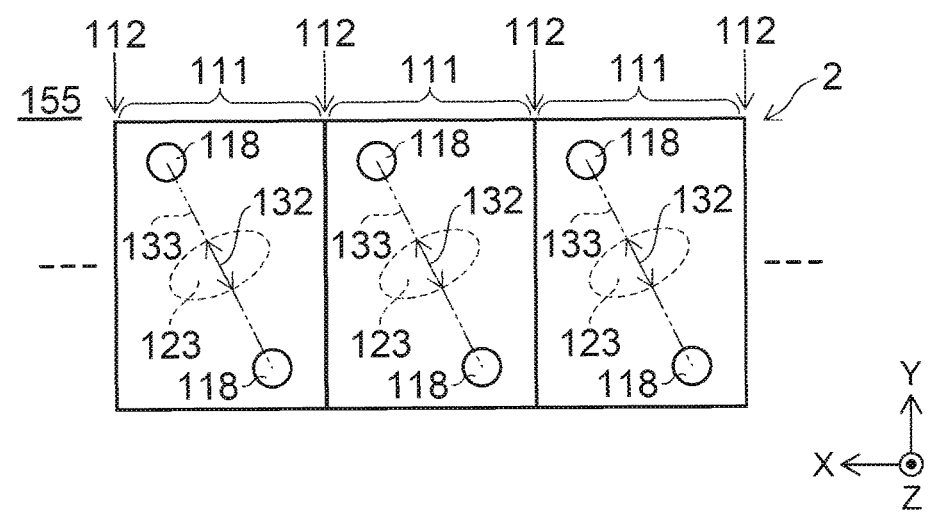
FIG. 15 is a schematic plan view of the staircase structure portion of a fourth variation of the first embodiment.

FIG. 15 is a schematic plan view of the staircase structure portion 2. FIG. 15 shows a semiconductor device 155 according to a fourth variation of the first embodiment.

As shown in FIG. 15, the semiconductor device 155 according to the fourth variation is different from the semiconductor device 154 of the third variation in that the major axis direction of the elliptic contact portion 123 is inclined with respect to the Y-direction. In the fourth variation, a minor axis 132 of the elliptic extends along a diagonal line 133 of the pillars 118. Thereby, the major axis direction of the elliptic is inclined with respect to the Y-direction. In the terrace 111, the space between the pillars 118 on the opposing corners is smaller. Therefore, the minor axis 132 of the elliptic is extended along the diagonal line 133, and thereby, compared to the case where the minor axis 132 extends not along the diagonal axis 133, it is possible to provide the larger elliptic contact portion 123.

Like the semiconductor device 155 according to the fourth variation, the major axis direction of the elliptic contact portion 123 may be inclined with respect to the Y-direction.

FIG. 16 is a schematic plan view of the memory cell array 1 and the staircase structure portion 2 of a semiconductor device of a second embodiment. FIG. 17 is a schematic sectional view along line 17-17 in FIG. 16.

As shown in FIG. 16 and FIG. 17, the second embodiment is different from the first embodiment in the positions in which the pillars 118 are provided. In the second embodiment, the pillars 118 are provided over the steps 112. The pillar 118 reaches e.g. the substrate 10 via the contiguous two terraces 111. The planar shape of the pillar 118 is e.g. an elliptic shape.

Figure 18:
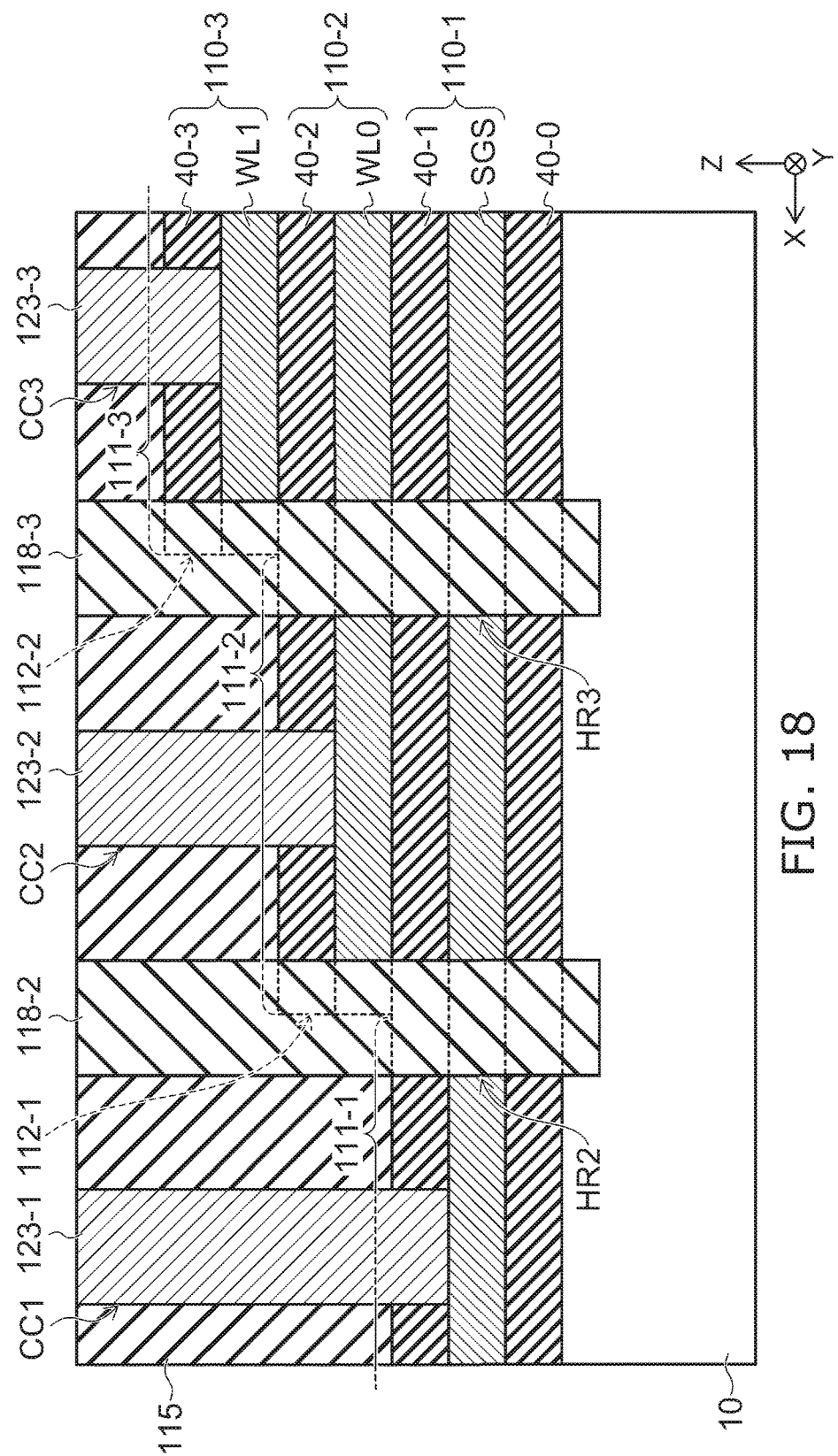
FIG. 18 is a schematic enlarged sectional view showing inside of a frame 18 in FIG. 17.

FIG. 18 is a schematic enlarged sectional view showing inside of a frame 18 in FIG. 17. In FIG. 18, three structures 110 are shown. In FIG. 18, for convenience, the structures are referred to as a first structure 110-1, a second structure 110-2, and a third structure 110-3.

As shown in FIG. 18, the first structure 110-1 is provided on the substrate 10 via e.g. the lowermost insulator 40-0. The first structure 110-1 includes the electrode layer SGS and the insulator 40-1. The insulator 40-1 is provided on the electrode layer SGS. The first structure 110-1 has the first terrace 111-1 on the surface of the insulator 40-1.

The second structure 110-2 is provided on the first structure 110-1 except a part on the first terrace 111-1. The second structure 110-2 includes the electrode layer WL0 and the insulator 40-2. The insulator 40-2 is provided on the electrode layer WL0. The second structure 110-2 has the second terrace 111-2 on the surface of the insulator 40-2. The first step 112-1 exists between the first terrace 111-1 and the second terrace 111-2.

The third structure 110-3 is provided on the second structure 110-2 except a part on the second terrace 111-2. The third structure 110-3 includes an electrode layer WL1 and an insulator 40-3. The insulator 40-3 is provided on the electrode layer WL1. The third structure 110-3 has a third terrace 111-3 on the surface of the insulator 40-3. A second step 112-2 exists between the second terrace 111-2 and the third terrace 111-3.

First insulating layers 115 are provided on the first terrace 111-1, the second terrace 111-2, and the third terrace 111-3.

In a part shown in FIG. 18, the second hole HR2 is provided in the first insulating layer 115, the first structure 110-1, and the second structure 110-2. The second hole HR2 reaches the substrate 10 via the first terrace 111-1, the first step 112-1, and the second terrace 111-2. The second pillar 118-2 is provided in the second hole HR2. A third hole HR3 is provided in the first insulating layer 115, the first structure 110-1, the second structure 110-2, and the third structure 110-3. The third hole HR3 reaches the substrate 10 via the second terrace 111-2, the second step 112-2, and the third terrace 111-3. A third pillar 118-3 is provided in the third hole HR3.

In the part shown in FIG. 18, the first contact hole CC1 is provided in the first insulating layer 115 and the insulator 40-1. The first contact hole CC1 reaches the electrode layer SGS via the first terrace 111-1. The first contact portion 123-1 is provided in the first contact hole CC1. The first contact portion 123-1 is electrically connected to the electrode layer SGS via the first terrace 111-1. The second contact hole CC2 is provided in the first insulating layer 115 and the insulator 40-2. The second contact hole CC2 reaches the electrode layer WL0 via the second terrace 111-2. The second contact portion 123-2 is provided in the second contact hole CC2. The second contact portion 123-2 is electrically connected to the electrode layer WL0 via the second terrace 111-2. The third contact hole CC3 is provided in the first insulating layer 115 and the insulator 40-3. A third contact hole CC3 reaches the electrode layer WL1 via the third terrace 111-3. A third contact portion 123-3 is provided in the third contact hole CC3. The third contact portion 123-3 is electrically connected to the electrode layer WL1 via the third terrace 111-3.

Like the second embodiment, the pillars 118 may be provided over the steps 112 and the pillars 118 may reach e.g. the substrate 10 via the contiguous two terraces 111. Also, in the second embodiment, like the first embodiment, it is possible to shrink the staircase structure portion 2.

Figure 19:
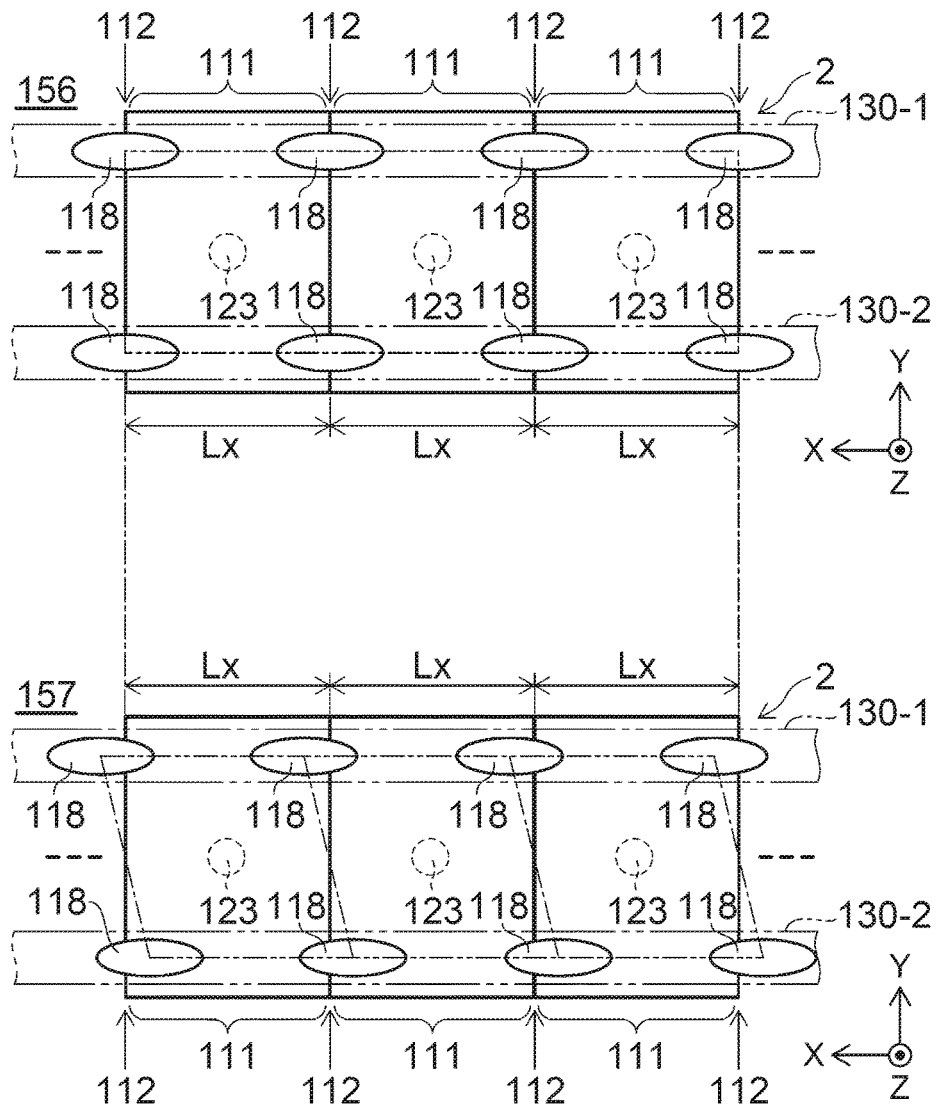
FIG. 19 is a schematic plan view of the staircase structure portion of the semiconductor device of the second embodiment and a first variation of the second embodiment.

FIG. 19 is a schematic plan view of the staircase structure portion 2. FIG. 19 shows a semiconductor device 156 of the second embodiment and a semiconductor device 157 according to a first variation of the second embodiment.

As shown in FIG. 19, in the semiconductor device 156 of the second embodiment, the plurality of pillars 118 is arranged in a rectangular pattern in the plan view. The rectangular arrangement pattern is repeated along the X-direction in the staircase structure portion 2. The contact portions 123 are provided in the rectangles.

On the other hand, in the semiconductor device 157 according to the first variation of the second embodiment, the plurality of pillars 118 is arranged in a parallelogram pattern in the plan view. The parallelogram arrangement pattern is repeated along the X-direction in the staircase structure portion 2. The contact portions 123 are provided in the parallelograms.

Like the semiconductor device 157, the plurality of pillars 118 may be arranged in the parallelogram pattern. Also, in the semiconductor device 157, it is possible to shrink the staircase structure portion 2.

Figure 20:
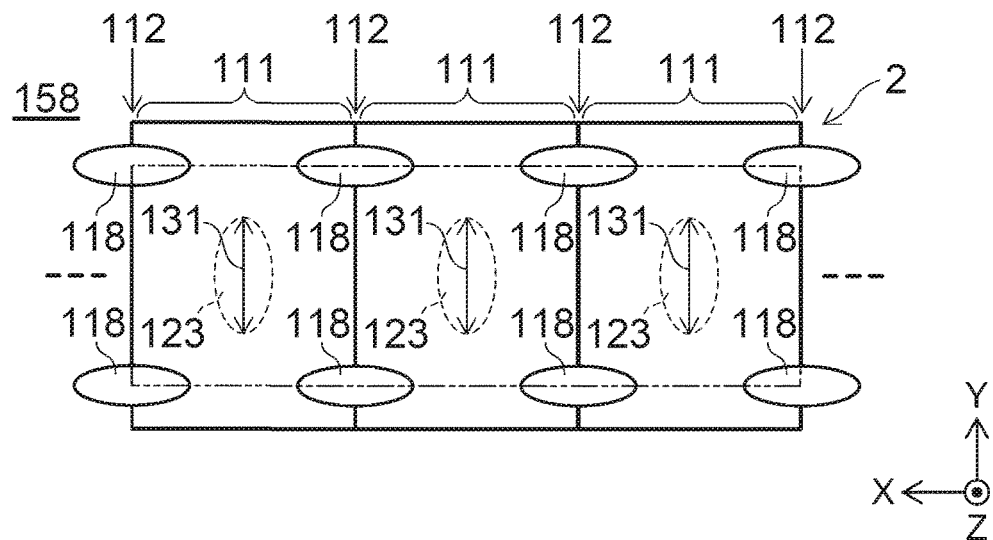
FIG. 20 is a schematic plan view of the staircase structure portion of a second variation of the second embodiment.

FIG. 20 is a schematic plan view of the staircase structure portion 2. FIG. 20 shows a semiconductor device 158 according to a second variation of the second embodiment.

As shown in FIG. 20, the semiconductor device 158 according to the second variation is an example in which the planar shape of the contact portion 123 is an elliptic shape. In the second variation, the major axis 131 of the elliptic extends along the Y-direction.

Like the semiconductor device 158, in the second embodiment, the planar shape of the contact portion 123 may be an elliptic shape. According to the second variation of the second embodiment, it is possible to shrink the staircase structure portion 2. Further, it is possible to suppress increase of the contact resistances between the electrode layers (SGD, WL, SGS) and the contact portion 123.

Figure 21:
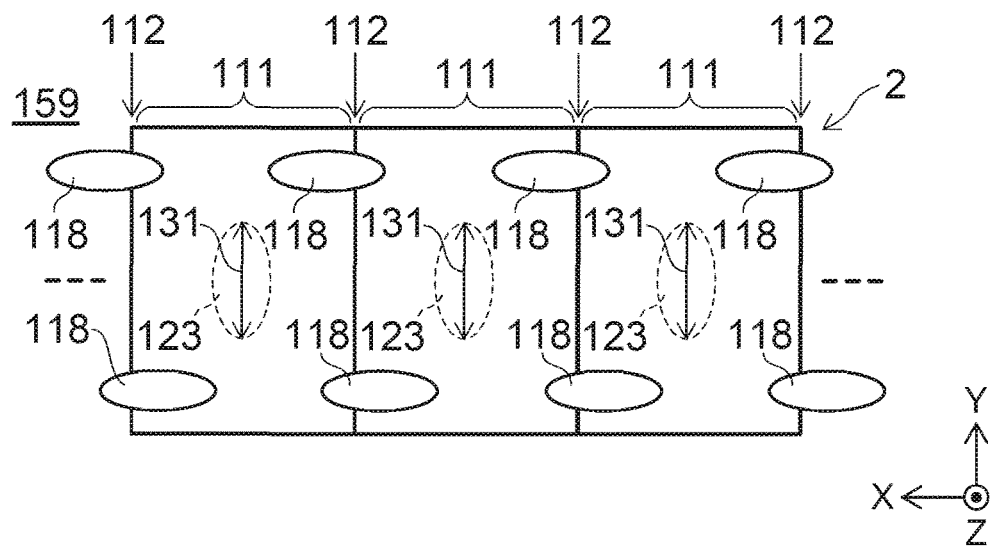
FIG. 21 is a schematic plan view of the staircase structure portion of a third variation of the second embodiment.

FIG. 21 is a schematic plan view of the staircase structure portion 2. FIG. 21 shows a semiconductor device 159 according to a third variation of the second embodiment.

As shown in FIG. 21, the semiconductor device 159 according to the third variation is an example in which the planar shape of the contact portion 123 of the semiconductor device 157 according to the first variation is an elliptic shape. In the third variation, the major axis 131 of the elliptic extends along the Y-direction.

Like the semiconductor device 159, in the first variation of the second embodiment, the planar shape of the contact portion 123 may be an elliptic shape.

Figure 22:
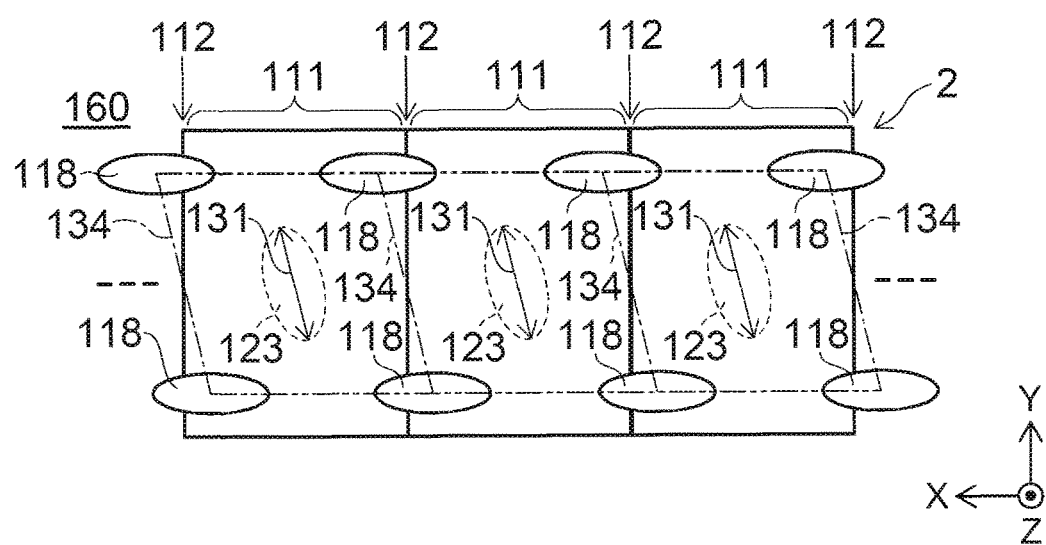
FIG. 22 is a schematic plan view of the staircase structure portion of a fourth variation of the second embodiment.

FIG. 22 is a schematic plan view of the staircase structure portion 2. FIG. 22 shows a semiconductor device 160 according to a fourth variation of the second embodiment.

As shown in FIG. 22, the semiconductor device 160 according to the fourth variation of the second embodiment is different from the semiconductor device 159 of the third variation in that the major axis direction of the elliptic contact portion 123 is inclined with respect to the Y-direction. In the fourth variation, the plurality of pillars 118 is arranged in a parallelogram pattern in the plan view. For example, in the fourth variation, the major axis 131 of the elliptic is disposed in parallel to a side 134 connecting the pillar 118 of the first row 130-1 and the pillar 118 of the second row 130-2. For example, the side 134 crosses the step 112.

As described above, in the semiconductor device 160, the major axis 131 of the elliptic may be inclined with respect to the Y-direction.

According to the embodiments, it is possible to shrink the staircase structure portion 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall in the scope and spirit of the inventions.

What is claimed is:

1. A semiconductor device comprising:
    a substrate;
    a first structure provided on the substrate, the first structure including a first electrode layer and a first insulator, the first structure having a first terrace on a surface of the first insulator;
    a second structure provided on the first structure except a part on the first terrace, the second structure including a second electrode layer and a second insulator, the second structure having a second terrace on a surface of the second insulator;
    a third structure provided on the second structure except a part on the second terrace, the third structure including a third electrode layer and a third insulator, the third structure having a third terrace on a surface of the third insulator;
    a first step provided between the first terrace and the second terrace;
    a second step provided between the second terrace and the third terrace;
    an insulating layer provided on the first terrace, the second terrace, and the third terrace;
    a first pillar provided in the insulating layer, the first structure, and the second structure, the first pillar reaching the substrate via the first terrace, the second terrace, and the first step;
    a second pillar provided in the insulating layer, the first structure, the second structure, and the third structure, the second pillar reaching the substrate via the second terrace, the third terrace, and the second step;
    a first contact portion provided in the insulating layer and the first insulator, the first contact portion electrically connected to the first electrode layer via the first terrace;
    a second contact portion provided in the insulating layer and the second insulator, the second contact portion electrically connected to the second electrode layer via the second terrace;
    a third contact portion provided in the insulating layer and the third insulator, the third contact portion electrically connected to the third electrode layer via the third terrace;
    a third pillar provided in the insulating layer, the first structure, and the second structure, the third pillar reaching the substrate via the first terrace, the second terrace, and the first step; and
    a fourth pillar provided in the insulating layer, the first structure, the second structure, and the third structure, the fourth pillar reaching the substrate via the second terrace, the third terrace, and the second step.

2. The device according to claim 1, further comprising:
    a first row including the first pillar and the second pillar; and
    a second row including the third pillar and the fourth pillar, wherein
    the first row and the second row extend along a direction in the first terrace, the second terrace, and the third terrace arranged.

3. The device according to claim 2, wherein the first contact portion, the second contact portion, and the third contact portion are located between the first row and the second row.

4. The device according to claim 1, wherein the first pillar, the second pillar, the third pillar, and the fourth pillar are arranged in a rectangular pattern in a plan view.

5. The device according to claim 1, wherein the first pillar, the second pillar, the third pillar, and the fourth pillar are arranged in a parallelogram pattern in a plan view.

6. A semiconductor device comprising:
    a substrate;
    a first structure provided on the substrate, the first structure including a first electrode layer and a first insulator, the first structure having a first terrace on a surface of the first insulator;
    a second structure provided on the first structure except a part on the first terrace, the second structure including a second electrode layer and a second insulator, the second structure having a second terrace on a surface of the second insulator;
    a third structure provided on the second structure except a part on the second terrace, the third structure including a third electrode layer and a third insulator, the third structure having a third terrace on a surface of the third insulator;
    a first step provided between the first terrace and the second terrace;
    a second step provided between the second terrace and the third terrace;
    an insulating layer provided on the first terrace, the second terrace, and the third terrace;
    a first pillar provided in the insulating layer, the first structure, and the second structure, the first pillar reaching the substrate via the first terrace, the second terrace, and the first step;
    a second pillar provided in the insulating layer, the first structure, the second structure, and the third structure, the second pillar reaching the substrate via the second terrace, the third terrace, and the second step;
    a first contact portion provided in the insulating layer and the first insulator, the first contact portion electrically connected to the first electrode layer via the first terrace;
    a second contact portion provided in the insulating layer and the second insulator, the second contact portion electrically connected to the second electrode layer via the second terrace; and
    a third contact portion provided in the insulating layer and the third insulator, the third contact portion electrically connected to the third electrode layer via the third terrace,
    wherein the first contact portion and the second contact portion have elliptic shapes when viewed from above.

7. A semiconductor device comprising:

a substrate;

a first structure provided on the substrate, the first structure including a first electrode layer and a first insulator, the first structure having a first terrace on a surface of the first insulator;

a second structure provided on the first structure except a part on the first terrace, the second structure including a second electrode layer and a second insulator, the second structure having a second terrace on a surface of the second insulator;

a third structure provided on the second structure except a part on the second terrace, the third structure including a third electrode layer and a third insulator, the third structure having a third terrace on a surface of the third insulator;

a first step provided between the first terrace and the second terrace;

a second step provided between the second terrace and the third terrace;

an insulating layer provided on the first terrace, the second terrace, and the third terrace;

a first pillar provided in the insulating layer, the first structure, and the second structure, the first pillar reaching the substrate via the first terrace, the second terrace, and the first step;

a second pillar provided in the insulating layer, the first structure, the second structure, and the third structure, the second pillar reaching the substrate via the second terrace, the third terrace, and the second step;

a first contact portion provided in the insulating layer and the first insulator, the first contact portion electrically connected to the first electrode layer via the first terrace;

a second contact portion provided in the insulating layer and the second insulator, the second contact portion electrically connected to the second electrode layer via the second terrace;

a third contact portion provided in the insulating layer and the third insulator, the third contact portion electrically connected to the third electrode layer via the third terrace;

a hole provided in the first structure, the second structure, and the third structure, the hole reaching the substrate;

a first memory cell provided in the hole;

a second memory cell provided in the hole, the second memory cell electrically connected to the first memory cell; and a third memory cell provided in the hole, the third memory cell electrically connected to the second memory cell.

8. The device according to claim 7, further comprising:

a semiconductor body provided in the hole; and a memory film provided between the semiconductor body and the first electrode layer, between the semiconductor body and the second electrode layer, and between the semiconductor body and the third electrode layer in the hole, the memory film including a charge storage film.

9. The device according to claim 7, wherein the first electrode layer is a gate electrode of the first memory cell, the second electrode layer is a gate electrode of the second memory cell, and the third electrode layer is a gate electrode of the third memory cell.

* * * * *